United States Patent
Oie et al.

(10) Patent No.: US 11,193,094 B2
(45) Date of Patent: Dec. 7, 2021

(54) LIQUID COMPOSITION FOR REDUCING DAMAGE OF COBALT, ALUMINA, INTERLAYER INSULATING FILM AND SILICON NITRIDE, AND WASHING METHOD USING SAME

(71) Applicant: MITSUBISHI GAS CHEMICAL COMPANY, INC., Chiyoda-ku (JP)

(72) Inventors: Toshiyuki Oie, Katsushika-ku (JP); Priangga Perdana Putra, Katsushika-ku (JP); Akinobu Horita, Katsushika-ku (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 5 days.

(21) Appl. No.: 16/634,454

(22) PCT Filed: Jul. 24, 2018

(86) PCT No.: PCT/JP2018/027592
§ 371 (c)(1),
(2) Date: Jan. 27, 2020

(87) PCT Pub. No.: WO2019/026677
PCT Pub. Date: Feb. 7, 2019

(65) Prior Publication Data
US 2021/0087501 A1    Mar. 25, 2021

(30) Foreign Application Priority Data
Jul. 31, 2017 (JP) .............................. JP2017-148396

(51) Int. Cl.
*C11D 3/37* (2006.01)
*C11D 7/08* (2006.01)
(Continued)

(52) U.S. Cl.
CPC .................. *C11D 7/08* (2013.01); *B08B 3/08* (2013.01); *C11D 7/3281* (2013.01); *C11D 11/0047* (2013.01); *H01L 21/02057* (2013.01)

(58) Field of Classification Search
CPC .......................... C11D 11/0047; C11D 3/3776
(Continued)

(56) References Cited

U.S. PATENT DOCUMENTS

| 2005/0245409 A1 | 11/2005 | Cernat et al. |
| 2006/0199749 A1* | 9/2006 | Suzuki ................ C11D 11/0047 510/175 |

(Continued)

FOREIGN PATENT DOCUMENTS

| JP | 2006-526895 A | 11/2006 |
| JP | 2016-536392 A | 11/2016 |

(Continued)

OTHER PUBLICATIONS

International Search Report dated Oct. 16, 2018 in PCT/JP2018/027592 filed Jul. 24, 2018, 1 page.

(Continued)

*Primary Examiner* — Gregory E Webb
(74) *Attorney, Agent, or Firm* — Oblon, McClelland, Maier & Neustadt, L.L.P.

(57) ABSTRACT

The present invention relates to: a liquid composition suitable for the washing of a semiconductor element provided with a low-dielectric-constant interlayer insulating film; and a method for washing a semiconductor element. The liquid composition according to the present invention is characterized by containing tetrafluoroboric acid (A) in an amount of 0.01 to 30% by mass, or boric acid (B1) and hydrogen fluoride (B2) at a (boric acid)/(hydrogen fluoride) ratio of (0.0001 to 5.0/by mass)/(0.005 to 5.0% by mass), and having a pH value of 0.0 to 4.0. The liquid composition according (Continued)

to the present invention can reduce the damage of a low-dielectric-constant interlayer insulating film, cobalt or a cobalt alloy, alumina, a zirconia-based hard mask and a silicon nitride during the process of producing a semiconductor integrated circuit, and accordingly can be used suitably for removing dry etching residues occurring on the surface of the semiconductor integrated circuit.

10 Claims, 1 Drawing Sheet

(51) Int. Cl.
    *B08B 3/08*     (2006.01)
    *C11D 7/32*     (2006.01)
    *C11D 11/00*     (2006.01)
    *H01L 21/02*     (2006.01)

(58) Field of Classification Search
    USPC .......................................................... 510/175
    See application file for complete search history.

(56) References Cited

U.S. PATENT DOCUMENTS

| | | | | |
|---|---|---|---|---|
| 2007/0060490 | A1* | 3/2007 | Skee | C11D 11/0047<br>510/175 |
| 2008/0139436 | A1* | 6/2008 | Reid | C11D 7/3209<br>510/176 |
| 2008/0261847 | A1* | 10/2008 | Visintin | H01L 21/31111<br>510/176 |
| 2009/0133716 | A1* | 5/2009 | Lee | H01L 21/02063<br>134/3 |
| 2010/0043823 | A1* | 2/2010 | Lee | H01L 21/31111<br>134/1.3 |
| 2010/0048443 | A1* | 2/2010 | Ohwada | H01L 21/02071<br>510/176 |
| 2015/0075570 | A1* | 3/2015 | Wu | C11D 7/08<br>134/41 |
| 2017/0240850 | A1 | 8/2017 | Oie et al. | |
| 2019/0071623 | A1* | 3/2019 | Kamimura | C11D 7/02 |
| 2021/0002591 | A1* | 1/2021 | Oie | C11D 7/32 |
| 2021/0047593 | A1* | 2/2021 | Oie | C11D 11/0047 |
| 2021/0087501 | A1* | 3/2021 | Oie | H01L 21/02057 |

FOREIGN PATENT DOCUMENTS

| | | |
|---|---|---|
| WO | WO 2004/100245 A1 | 11/2004 |
| WO | WO 2008/050785 A1 | 5/2008 |
| WO | WO 2013/101907 A1 | 7/2013 |
| WO | WO 2015/060954 A1 | 4/2015 |
| WO | WO 2015/089023 A1 | 6/2015 |
| WO | WO 2016/076033 A1 | 5/2016 |

OTHER PUBLICATIONS

Padmanaban et al., "Progress in Spin-on Hard Mask Materials for Advanced Lithography," Journal of Photopolymer Science and Technology, vol. 27, No. 4, 2014, pp. 503-509.
Bakke et al., "Etch Stop Materials for Release by Vapor HF Etching," 16$^{th}$ MME workshop, Goeteborg, Sweden, 2005, 4 pages.
Extended European Search Report dated Jul. 20, 2020 in Patent Application No. 18841579.8, 8 pages.

* cited by examiner

LIQUID COMPOSITION FOR REDUCING DAMAGE OF COBALT, ALUMINA, INTERLAYER INSULATING FILM AND SILICON NITRIDE, AND WASHING METHOD USING SAME

TECHNICAL FIELD

The present invention relates to a liquid composition, which suppresses damage to a low-dielectric-constant interlayer insulating film, cobalt or a cobalt alloy, alumina, a zirconia-based hard mask and silicon nitride and removes a dry etching residue existing on a surface of a semiconductor integrated circuit in the process of producing the semiconductor integrated circuit, and a washing method using the same.

BACKGROUND ART

Recently, the miniaturization of design rules has been accelerated, the conductive wiring material has been changed from aluminum to copper which has lower electrical resistance, and the interlayer insulating film has been changed from a silicone oxide film to a low dielectric constant film (a film having a dielectric constant of less than 3, hereinafter referred to as "low-k film").

However, with the miniaturization of wiring, electromigration of copper easily occurs due to increase in the density of current flowing through the wiring. In response to this, a technique of using cobalt as a highly-reliable wiring material instead of copper and a technique of introducing a cobalt alloy as a cap metal for preventing electromigration of copper have been reported.

Further, patterns of 0.2 μm or less have problems in which, for example, the aspect ratio of a pattern of a resist having a film thickness of 1 μm (the ratio obtained by dividing the film thickness of the resist by the line width of the resist) is too large, resulting in collapse of the pattern. In order to solve this, sometimes used is the hard mask method in which: a film containing titanium or silicon (hereinafter referred to as "the hard mask") is inserted between a pattern film on which a pattern is desired to be actually formed and a resist film; a resist pattern is transferred to the hard mask by dry etching; and after that, this hard mask is used as an etching mask to transfer the pattern to the film on which the pattern is desired to be actually formed by dry etching.

In this method, a gas to be used for etching the film on which the pattern is desired to be actually formed may be changed from a gas to be used for etching the hard mask. It is possible to select a gas which can secure a selection ratio with the resist when etching the hard mask and to select a gas which can secure a selection ratio with the hard mask when etching the actual film. For this reason, there is an advantage that a pattern can be formed with a thin resist. As the hard mask, other than the aforementioned film containing titanium or silicon, a hard mask containing zirconia has also been proposed (Non-Patent Literature 1).

When a dry etching residue is removed with oxygen plasma, there is a problem that a low-k film, cobalt and a cobalt alloy and an etch stop layer are damaged due to exposure to oxygen plasma or the like, resulting in significant deterioration of electrical characteristics. For this reason, in the production of a semiconductor element using a low-k film, it is desired to employ a method of suppressing damage to a low-k film, cobalt and a cobalt alloy and an etch stop layer while removing a dry etching residue at a level comparable to that of an oxygen plasma process. Moreover, when using a hard mask, it is also required to suppress damage to a material including the hard mask.

In the process of forming a via by means of dry etching, when dry etching is carried out until cobalt as a wiring material is reached, cobalt is exposed to a dry etching gas, resulting in change in quality thereof, and it may affect electrical properties. For this reason, a process, wherein: an etch stop layer is provided on cobalt; a via is formed by dry etching until the etch stop layer is reached; and then the etch stop layer at the bottom of the via is removed by a method having a small influence on cobalt to bare cobalt, is considered.

When forming a via by dry etching, a fluorine-based gas is generally selected. In this regard, when alumina is selected as an etch stop layer, since alumina is highly resistant to the fluorine-based gas, it advantageously functions as the etch stop layer even in the form of a thin film (Non-Patent Literature 2).

Patent Literature 1-3 propose a wiring forming method using a liquid composition. However, when using these liquid compositions, a dry etching residue cannot be removed at a satisfactory level, and damage to any of cobalt, alumina and a low-dielectric-constant interlayer insulating film cannot be suppressed at a satisfactory level. Therefore, these liquid compositions cannot be used for the above-described purpose (see Comparative Examples 1-3).

CITATION LIST

Patent Literature

Patent Literature 1: International Publication WO2016/076033 pamphlet
Patent Literature 2: International Publication WO2015/089023 pamphlet
Patent Literature 3: Japanese National-phase PCT Laid-Open Patent Publication No. 2016-536392

Non-Patent Literature

Non-Patent Literature 1: M Padmanaban et al, J. Photopolym. Sci. Technol., 27 (2014) 503
Non-Patent Literature 2: 16th MME workshop, Goeteborg, Sweden, 2005 "Etch stop materials for release by vapor HF etching"

SUMMARY OF INVENTION

Technical Problem

It is desired to provide a liquid composition, which suppresses damage to a low-dielectric-constant interlayer insulating film, cobalt or a cobalt alloy, alumina, a zirconia-based hard mask and silicon nitride and removes a dry etching residue existing on a surface of a semiconductor integrated circuit in the process of producing the semiconductor integrated circuit, and a washing method.

Solution to Problem

The present invention is as described below.
[1] A liquid composition, which comprises tetrafluoroboric acid (A) in an amount of 0.01 to 30% by mass, or boric acid (B1) and hydrogen fluoride (B2) at a ratio of (boric acid)/(hydrogen fluoride) of (0.0001 to 5.0% by mass)/(0.005 to 5.0% by mass), and which has a pH value of 0.0 to 4.0.

[2] The liquid composition according to item [1], which comprises tetrafluoroboric acid (A) and hydrogen fluoride (B2) at a ratio of (tetrafluoroboric acid)/(hydrogen fluoride) of (0.01 to 30% by mass)/(0.005 to 5.0% by mass).

[3] The liquid composition according to item [1], which comprises tetrafluoroboric acid (A), boric acid (B1) and hydrogen fluoride (B2) at a ratio of (tetrafluoroboric acid)/(boric acid)/(hydrogen fluoride) of (0.01 to 30% by mass)/(0.0001 to 5.0% by mass)/(0.005 to 5.0% by mass).

[4] The liquid composition according to any one of items [1] to [3], wherein the concentration of said tetrafluoroboric acid (A) is 0.3 to 15% by mass.

[5] The liquid composition according to any one of items [1] to [4], wherein the concentration of said boric acid (B1) is 0.0003 to 3.5% by mass.

[6] The liquid composition according to any one of items [1] to [5], wherein the concentration of said hydrogen fluoride (B2) is 0.02 to 2.0% by mass.

[7] The liquid composition according to any one of items [1] to [6], which comprises a benzotriazole compound (C) in an amount of 0.01 to 10% by mass.

[8] The liquid composition according to item [7], wherein said benzotriazole compound (C) includes at least one selected from the group consisting of benzotriazole, 5-methyl-1H-benzotriazole and 2,2'-[[(methyl-1H-benzotriazol-1-yl)methyl]imino]bisethanol.

[9] The liquid composition according to any one of items [1] to [8], which comprises a compound (D) having a pyrrolidone structure in an amount of 0.0001 to 5% by mass.

[10] The liquid composition according to item [9], wherein the weight average molecular weight of said compound (D) having the pyrrolidone structure is 1000 to 5000000, and wherein the ratio of the pyrrolidone structure unit is 10% or more.

[11] A method for washing a semiconductor element having a low-dielectric-constant interlayer insulating film using the liquid composition according to any one of items [1] to [10].

Advantageous Effects of Invention

The liquid composition of the present invention can be suitably used for washing a semiconductor element having a low-dielectric-constant interlayer insulating film.

According to a preferred embodiment of the present invention, by using the liquid composition of the present invention, it is possible to suppress damage to a low-dielectric-constant interlayer insulating film, cobalt or a cobalt alloy, alumina, a zirconia-based hard mask and silicon nitride and remove a dry etching residue on a surface of a product to be treated in the process of producing a semiconductor circuit, and it is possible to produce a semiconductor element having high precision and high quality with a high yield.

DESCRIPTION OF EMBODIMENT

Figure 1:
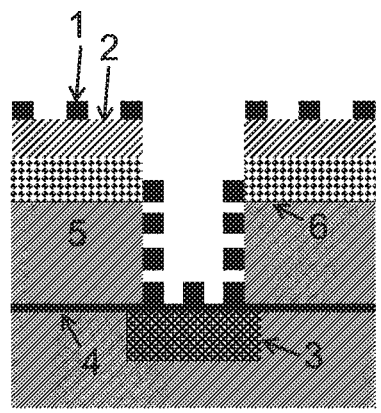
FIG. 1 is a schematic cross sectional view of a semiconductor element prior to removal of a dry etching residue, which has a structure composed of a low-dielectric-constant interlayer insulating film, cobalt or cobalt alloy, alumina, a zirconia-based hard mask and silicon nitride, wherein the bottom of a via is alumina, according to one embodiment.

The liquid composition of the present invention contains at least tetrafluoroboric acid (A) or boric acid (B1) and hydrogen fluoride (B2). The liquid composition of the present invention may contain either tetrafluoroboric acid (A), or boric acid (B1) and hydrogen fluoride (B2). Alternatively, tetrafluoroboric acid (A) may be used in combination with one or both of boric acid (B) and hydrogen fluoride (B2). Hereinafter, these will be described in detail.

[Tetrafluoroboric Acid (A)]

As tetrafluoroboric acid (A) to be used in the present invention, a commercially-available product may be used. Alternatively, tetrafluoroboric acid (A) may be prepared by reacting boric acid with hydrogen fluoride.

In the case of using tetrafluoroboric acid (A), the concentration thereof in the liquid composition is 0.01 to 30% by mass, preferably 0.05 to 25% by mass, more preferably 0.1 to 20% by mass, and particularly preferably 0.3 to 15% by mass. When the concentration is within these ranges, a dry etching residue can be removed while effectively suppressing damage to cobalt, alumina, an interlayer insulating film and silicon nitride.

[Boric Acid (B1) and Hydrogen Fluoride (B2)]

In the case of using boric acid (B1) and hydrogen fluoride (B2) in combination, regarding the concentration of boric acid (B1) and hydrogen fluoride (B2) in the liquid composition, (boric acid)/(hydrogen fluoride) is (0.0001 to 5.0% by mass)/(0.005 to 5.0% by mass), preferably (0.0002 to 4.0% by mass)/(0.01 to 4.0% by mass), more preferably (0.0003 to 3.5% by mass)/(0.01 to 3.0% by mass), and particularly preferably (0.0005 to 1.5% by mass)/(0.02 to 2.0% by mass). When the concentration is within these ranges, a dry etching residue can be removed while effectively suppressing damage to cobalt, alumina, an interlayer insulating film and silicon nitride.

Boric acid (B1) may be added to tetrafluoroboric acid (A). Regarding the concentration thereof in the liquid composition in this case, (tetrafluoroboric acid)/(boric acid) is (0.01 to 30% by mass)/(0.0001 to 2.0% by mass), preferably (0.03 to 25% by mass)/(0.0002 to 1.0% by mass), more preferably (0.06 to 20% by mass)/(0.0004 to 0.5% by mass), and particularly preferably (0.1 to 15% by mass)/(0.0005 to 0.2% by mass). When the concentration is within these ranges, anticorrosion property of a low-dielectric-constant interlayer insulating film and silicon nitride is improved.

Hydrogen fluoride (B2) may be added to tetrafluoroboric acid (A). Regarding the concentration thereof in the liquid composition in this case, (tetrafluoroboric acid)/(hydrogen fluoride) is (0.01 to 30% by mass)/(0.005 to 5.0% by mass), preferably (0.05 to 25% by mass)/(0.01 to 4.0% by mass), more preferably (0.1 to 20% by mass)/(0.01 to 3.0% by mass), and particularly preferably (0.3 to 15% by mass)/(0.02 to 2.0% by mass). When the concentration is within these ranges, anticorrosion property of a low-dielectric-constant interlayer insulating film and silicon nitride is improved.

Tetrafluoroboric acid (A) may be used in combination with boric acid (B1) and hydrogen fluoride (B2). Regarding the concentration in this case, (tetrafluoroboric acid)/(boric acid)/(hydrogen fluoride) is (0.01 to 30% by mass)/(0.0001 to 5.0% by mass)/(0.005 to 5.0% by mass), preferably (0.05 to 25% by mass)/(0.0002 to 4.0% by mass)/(0.01 to 4.0% by mass), more preferably (0.1 to 20% by mass)/(0.0003 to 3.5% by mass)/(0.01 to 3.0% by mass), and particularly preferably (0.3 to 15% by mass)/(0.0005 to 1.5% by mass)/(0.02 to 2.0% by mass). When the concentration is within these ranges, anticorrosion property of a low-dielectric-constant interlayer insulating film and silicon nitride is improved.

[Benzotriazole Compound (C)]

In the present invention, a benzotriazole compound (C) may be added in order to improve anticorrosion property of cobalt.

The benzotriazole compound (C) is a compound having a benzotriazole skeleton, and specific examples thereof include benzotriazole, 5-methyl-1H-benzotriazole and 2,2'-[[(methyl-1H-benzotriazol-1-yl)methyl]imino]bisethanol. These substances may be used solely, or two or more of them may be used in combination.

When using the benzotriazole compound (C), the concentration thereof in the liquid composition is 0.01 to 10% by mass, preferably 0.02 to 8.0% by mass, more preferably 0.03 to 6.0% by mass, and particularly preferably 0.05 to 5.0% by mass. When the concentration is within these ranges, damage to cobalt or a cobalt alloy can be effectively suppressed.

[Compound (D) Having Pyrrolidone Structure]

In the present invention, a compound (D) having a pyrrolidone structure may be added in order to improve anticorrosion property of a low-dielectric-constant interlayer insulating film and cobalt.

The compound (D) having the pyrrolidone structure to be used in the present invention is an oligomer or polymer whose repeating unit includes a pyrrolidone unit, and specific examples thereof include polyvinylpyrrolidone, a random copolymer containing a pyrrolidone unit, an alternating copolymer containing a pyrrolidone unit, a block copolymer containing a pyrrolidone unit, and a branched polymer containing a pyrrolidone unit.

The weight average molecular weight of the compound (D) having the pyrrolidone structure is 1000 to 5000000, preferably 1300 to 4000000, more preferably 1600 to 3500000, and particularly preferably 2000 to 2800000, and the ratio of the repeating unit of the pyrrolidone unit in the compound (D) having the pyrrolidone structure is 10% or more, preferably 20% or more, more preferably 25% or more, and particularly preferably 30% or more based on the number of repeating units. When these are within the above-described ranges, damage to a low-dielectric-constant interlayer insulating film and cobalt or a cobalt alloy can be effectively suppressed.

As the compound (D) having the pyrrolidone structure, for example, PITZCOL series manufactured by DKS Co. Ltd. are available and can be suitably used.

When using the compound (D) having the pyrrolidone structure, the concentration thereof in the liquid composition is preferably 0.0001 to 5% by mass, more preferably 0.0001 to 5.0% by mass, even more preferably 0.0003 to 3.0% by mass, still more preferably 0.0005 to 2.0% by mass, and particularly preferably 0.001 to 1.0% by mass. When the concentration is within the above-described ranges, damage to a low-dielectric-constant interlayer insulating film and cobalt or a cobalt alloy can be effectively suppressed.

[Other Components]

In the liquid composition of the present invention, an additive which is conventionally used in liquid compositions for semiconductors may be blended within a range in which the purpose of the present invention is not impaired.

In the liquid composition of the present invention, if desired, an alkali compound which is conventionally used in liquid compositions for semiconductors may be blended within a range in which the purpose of the present invention is not impaired.

For example, as the additive, an alkali, an acid, a chelating agent, a surfactant, a defoaming agent, an oxidant, a reducing agent, a metal anticorrosive, a water-soluble organic solvent, etc. can be added.

[Method for Preparing Liquid Composition]

The liquid composition of the present invention is prepared by adding water (preferably ultrapure water) to tetrafluoroboric acid (A) or boric acid (B1) and hydrogen fluoride (B2) or the like and stirring the mixture until it becomes homogeneous.

The pH value of the liquid composition is 0.0 to 4.0, preferably 0.02 to 3.8, more preferably 0.03 to 3.7, even more preferably 0.2 to 3.8, still more preferably 0.3 to 3.7, and particularly preferably 0.5 to 3.5. When the value is within the above-described ranges, a dry etching residue can be removed while effectively suppressing damage to cobalt, alumina, an interlayer insulating film and silicon nitride.

[Method for Using Liquid Composition]

The temperature at which the liquid composition of the present invention is used is usually 10 to 30° C., and preferably 15 to 25° C., and may be appropriately selected depending on etching conditions and a semiconductor substrate to be used.

The time for use of the liquid composition of the present invention is usually 0.2 to 60 minutes, and may be appropriately selected depending on etching conditions and a semiconductor substrate to be used. As a rinse liquid to be used after use of the liquid composition of the present invention, both an organic solvent and water can be used.

[Semiconductor Element and Display Element]

The semiconductor element and the display element for which the present invention can be suitably used include: a substrate material such as silicon, amorphous silicon, polysilicon and glass; an insulating material such as silicon oxide, silicon nitride, silicon carbide and derivatives thereof; a material such as cobalt, cobalt alloy, tungsten and titanium-tungsten; a compound semiconductor such as gallium-arsenic, gallium-phosphorus, indium-phosphorus, indium-gallium-arsenic and indium-aluminum-arsenic; and an oxide semiconductor such as chromium oxide, and particularly an element in which a low-dielectric-constant interlayer insulating film is used.

The dry etching residue to be targeted by the present invention is generated, for example, at the time of forming a via or trench in the low-dielectric-constant interlayer insulating film by means of dry etching using a zirconia-based hard mask as a mask. A part of the dry etching residue is generated when an etching gas comes into contact with the zirconia-based hard mask. Accordingly, the dry etching residue to be targeted usually contains zirconium.

FIG. 1 is a schematic cross sectional view of a semiconductor element prior to removal of a dry etching residue according to one embodiment. In FIG. 1, a low-dielectric-constant interlayer insulating film 5, cobalt or cobalt alloy 3, alumina 4, a zirconia-based hard mask 2 and silicon nitride 6 are possessed, and the bottom of a via is alumina 4.

Figure 2:
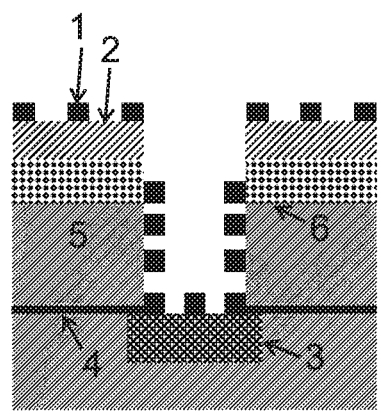
FIG. 2 is a schematic cross sectional view of a semiconductor element prior to removal of a dry etching residue, which has a structure composed of a low-dielectric-constant interlayer insulating film, cobalt or cobalt alloy, alumina, a zirconia-based hard mask and silicon nitride, wherein the bottom of a via is cobalt or cobalt alloy, according to one embodiment.

FIG. 2 is a schematic cross sectional view of a semiconductor element prior to removal of a dry etching residue according to one embodiment. In FIG. 2, a low-dielectric-constant interlayer insulating film 5, cobalt or cobalt alloy 3, alumina 4, a zirconia-based hard mask 2 and silicon nitride 6 are possessed, and the bottom of a via is cobalt or cobalt alloy 3.

EXAMPLES

Hereinafter, the present invention will be specifically described based on working examples, however embodiments can be suitably changed within a range in which the effects of the present invention are exerted.

Note that "%" means "% by mass" unless otherwise specified.

[Wafer for Evaluation]
<Wafer for evaluation A>: Wafer for evaluation of removal state of dry etching residue and damage to zirconia-based hard mask From bottom to top, films of silicon nitride, an interlayer insulating film, silicon nitride, a hard mask (zirconia) and a photoresist were formed, and then the photoresist was patterned.

A predetermined part of the hard mask was removed by dry etching using the photoresist as a mask, and the photoresist was removed by ashing with oxygen plasma. In addition, a via was formed in the silicon nitride film and the interlayer insulating film by dry etching using the hard mask as a mask, thereby providing a wafer for evaluation A.

<Wafer with film>: Wafer for evaluation of damage to cobalt, alumina, low-dielectric-constant interlayer insulating film and silicon nitride caused by liquid composition A wafer with a film in which each of films of cobalt, alumina, a low-dielectric-constant interlayer insulating film and silicon nitride was formed was used.

As the low-dielectric-constant interlayer insulating film, TEOS (tetraethoxysilicate), which is a type of low-dielectric-constant interlayer insulating film, was used.

[Evaluation Methods]
<Removal State of Dry Etching Residue>

The wafer for evaluation A after treated with each liquid composition was subjected to SEM observation.
Measurement apparatus: Ultra-high resolution field-emission scanning electron microscope SU9000 manufactured by Hitachi High-Technologies Corporation (100,000×)
Judgment Method:
  E: The dry etching residue was completely removed.
  P: The dry etching residue was insufficiently removed.
  E was regarded as acceptable.
<Film Thickness>

The film thickness of the wafer with the film was measured by using X-Ray Fluorescent Analyzer SEA1200VX manufactured by SII Nano Technology Inc. (film thickness measurement apparatus A) or an optical film thickness gauge n&k 1280 manufactured by n&k Technology Inc. (film thickness measurement apparatus B). The film thickness measurement apparatus A was used for a wafer with a cobalt film, and the film thickness measurement apparatus B was used for a wafer with an alumina film, a wafer with a TEOS film and a wafer with a silicon nitride film, and each film thickness was measured.

<E.R. (Etching Rate)>

Each wafer with the film was treated with the liquid composition, and E.R. of each material was calculated by dividing the difference between the film thicknesses before and after the treatment by the treatment time.
  Cobalt: the case where E.R. was 5 Å/min or lower
  Alumina: the case where E.R. was 55 Å/min or lower
  TEOS: the case where E.R. was 4.5 Å/min or lower
  Silicon nitride: the case where E.R. was 5 Å/min or lower
  The above-described cases were regarded as acceptable.

Examples 1-40

The wafer for evaluation A and the respective wafers with the films were used in the test. Each wafer was immersed in a liquid composition shown in Table 1 at a temperature shown in Table 2. After that, rinsing with ultrapure water and drying by dry nitrogen gas jet were carried out. The wafer for evaluation A was treated for 1 minute in all the cases and the wafer after the treatment was observed by SEM.

Regarding the respective wafers with the films, the wafer with the cobalt film and the wafer with the TEOS film were treated for 30 minutes, the wafer with the alumina film was treated for 5 minutes, and the wafer with the silicon nitride film was treated for 10 minutes. E.R. was calculated from film thicknesses before and after the treatment.

The evaluation results are shown in Table 2. It is understood that in Examples 1-13 to which the liquid composition of the present invention was applied, damage to alumina, the low-dielectric-constant interlayer insulating film and silicon nitride was prevented while the dry etching residue was completely removed. Further, it is understood that in Examples 14-40, damage to cobalt, alumina, the low-dielectric-constant interlayer insulating film and silicon nitride was prevented while the dry etching residue was completely removed.

Comparative Examples 1-6

The wafer for evaluation A and the respective wafers with the films were washed with each of the liquid compositions shown in Table 3. The washing temperatures and the evaluation results are shown in Table 4. It is understood that the liquid compositions of Comparative Examples 1-6 cannot be used for the purpose of suppressing damage to cobalt, alumina, the low-dielectric-constant interlayer insulating film and silicon nitride and removing the dry etching residue on the surface of the product to be treated in the process for manufacturing the semiconductor integrated circuit that is the target of the present invention.

TABLE 1

| Liquid composition | $HBF_4$ (A) % by mass | $B(OH)_3$ (B1) % by mass | HF (B2) % by mass | BT compound (C) Type | % by mass | Additive (D) Type | % by mass | Other components Type | % by mass | $H_2O$ % by mass |
|---|---|---|---|---|---|---|---|---|---|---|
| 1A | 1.5 | | | | | | | | | 98.5 |
| 1B | 0.3 | | | | | | | | | 99.7 |
| 1C | 0.05 | | 0.04 | | | | | | | 99.9 |
| 1D | 1.0 | | 0.005 | | | | | | | 99.0 |
| 1E | | 0.05 | 0.09 | | | | | | | 99.9 |
| 1F | | 0.005 | 0.02 | | | | | | | 100 |
| 1G | 1.5 | 0.01 | | | | | | | | 98.5 |
| 1H | | 1.5 | 2.0 | | | | | | | 96.5 |
| 1I | | 0.0005 | 0.02 | | | | | | | 100 |
| 1J | 15 | 0.2 | | | | | | | | 84.8 |
| 1K | 0.1 | 0.0005 | | | | | | | | 99.9 |

TABLE 1-continued

| Liquid composition | HBF₄ (A) % by mass | B(OH)₃ (B1) % by mass | HF (B2) % by mass | BT compound (C) Type | % by mass | Additive (D) Type | % by mass | Other components Type | % by mass | H₂O % by mass |
|---|---|---|---|---|---|---|---|---|---|---|
| 1L | 15 | | | | | | | | | 85.0 |
| 1M | 0.3 | | 0.03 | | | | | 1A2P | 0.3 | 99.4 |
| 1N | 1.5 | | | 5-MBT | 0.5 | | | | | 98.0 |
| 1O | 0.05 | | 0.04 | 5-MBT | 0.5 | | | | | 99.4 |
| 1P | | 0.05 | 0.09 | 5-MBT | 0.5 | | | | | 99.4 |
| 1Q | 1.5 | 0.01 | | 5-MBT | 0.5 | | | | | 98.0 |
| 1R | | 1.5 | 2.0 | 5-MBT | 0.5 | | | | | 96.0 |
| 1S | | 0.0005 | 0.02 | 5-MBT | 0.5 | | | | | 99.5 |
| 1T | 15 | 0.2 | | 5-MBT | 0.5 | | | | | 84.3 |
| 1U | 0.1 | 0.0005 | | 5-MBT | 0.5 | | | | | 99.4 |
| 1V | 0.1 | 0.0005 | | 5-MBT | 0.05 | | | | | 99.9 |
| 1W | 15 | | | 5-MBT | 0.5 | | | | | 84.5 |
| 1X | | 0.05 | 0.09 | BT | 1.0 | | | | | 98.9 |
| 1AA | 15 | | | TTLYK | 5.0 | | | | | 80.0 |
| 1AB | 0.3 | | 0.03 | 5-MBT | 0.5 | | | 1A2P | 0.3 | 98.9 |
| 1AC | | 0.05 | 0.1 | 5-MBT | 0.5 | | | KOH | 0.001 | 99.4 |
| 1AD | | 0.05 | 0.1 | 5-MBT | 0.5 | | | NH₃ | 0.01 | 99.3 |
| 1AE | | 0.05 | 0.1 | 5-MBT | 0.5 | | | TMAH | 0.01 | 99.3 |
| 1AF | | 0.05 | 0.1 | 5-MBT | 0.5 | | | 1A2P | 0.01 | 99.3 |
| 1AG | | 0.05 | 0.1 | 5-MBT | 0.5 | PVP-K120 | 0.1 | | | 99.3 |
| 1AH | | 0.05 | 0.1 | 5-MBT | 0.5 | PVP-K90 | 0.1 | | | 99.3 |
| 1AI | | 0.05 | 0.1 | 5-MBT | 0.5 | PVP-K90 | 0.001 | | | 99.4 |
| 1AJ | | 0.05 | 0.1 | 5-MBT | 0.5 | PVP-K30 | 0.02 | | | 99.3 |
| 1AK | | 0.05 | 0.1 | 5-MBT | 0.5 | PVP-K15 | 0.02 | | | 99.3 |
| 1AL | | 0.05 | 0.1 | 5-MBT | 0.5 | PVP-K12 | 0.1 | | | 99.3 |
| 1AM | | 0.05 | 0.09 | 5-MBT | 0.5 | VPVA73 | 0.02 | | | 99.3 |
| 1AN | | 0.05 | 0.09 | 5-MBT | 0.5 | VPVA64 | 0.02 | | | 99.3 |
| 1AO | | 0.05 | 0.09 | 5-MBT | 0.5 | VPVA37 | 0.02 | | | 99.3 |
| 1AP | | 0.05 | 0.09 | 5-MBT | 0.5 | V-7154 | 0.02 | | | 99.3 |

5-MBT: 5-methyl-1H-benzotriazole
BT: benzotriazole
TTLYK: 2,2'-[[(methyl-1H-benzotriazol-1-yl)methyl]imino]bisethanol
TMAH: tetramethylammonium hydroxide
1A2P: 1-amino-2-propanol
PVP-K120: polyvinylpyrrolidone (weight average molecular weight: 2800000)
PVP-K90: polyvinylpyrrolidone (weight average molecular weight: 1200000)
PVP-K30: polyvinylpyrrolidone (weight average molecular weight: 45000)
PVP-K15: polyvinylpyrrolidone (weight average molecular weight: 10000)
PVP-K12: polyvinylpyrrolidone (weight average molecular weight: 2000)
VPVA73: vinyl pyrrolidone/vinyl acetate copolymer (ratio of repeating unit of vinyl pyrrolidone unit: 70%)
VPVA64: vinyl pyrrolidone/vinyl acetate copolymer (ratio of repeating unit of vinyl pyrrolidone unit: 60%)
VPVA37: vinyl pyrrolidone/vinyl acetate copolymer (ratio of repeating unit of vinyl pyrrolidone unit: 30%)
V-7154: graft copolymer having polyvinyl alcohol as the main chain and polyvinylpyrrolidone as the side chain (manufactured by DKS Co. Ltd.)

TABLE 2

| Examples | Liquid composition | pH | Temperature (° C.) | Removal of residue | E.R. (Å/min) Co | Al₂O₃ | TEOS | SiN |
|---|---|---|---|---|---|---|---|---|
| 1 | 1A | 1.5 | 20 | E | unmeasured | 38 | 1 | 2.3 |
| 2 | 1B | 1.8 | 30 | E | unmeasured | 55 | 0.3 | 1.1 |
| 3 | 1C | 2.7 | 20 | E | unmeasured | 37 | 2.3 | 4.4 |
| 4 | 1D | 1.4 | 20 | E | unmeasured | 46 | 0.6 | 1.8 |
| 5 | 1E | 2.7 | 20 | E | unmeasured | 36 | 2.4 | 4.4 |
| 6 | 1F | 2.9 | 30 | E | unmeasured | 54 | 0.2 | 3.8 |
| 7 | 1G | 1.5 | 20 | E | unmeasured | 36 | 0.5 | 1.7 |
| 8 | 1H | 1.0 | 10 | E | unmeasured | 33 | 4.4 | 3.1 |
| 9 | 1I | 3.0 | 30 | E | unmeasured | 49 | 0.4 | 4.4 |
| 10 | 1J | 0.5 | 10 | E | unmeasured | 17 | 1.8 | 1.7 |
| 11 | 1K | 2.2 | 30 | E | unmeasured | 37 | <0.1 | 1.2 |
| 12 | 1L | 0.6 | 10 | E | unmeasured | 22 | 2.4 | 1.6 |
| 13 | 1M | 3.5 | 30 | E | unmeasured | 55 | 1.8 | 4.6 |
| 14 | 1N | 1.1 | 20 | E | 5.0 | 39 | 1.1 | 2 |
| 15 | 1O | 2.3 | 20 | E | 2.0 | 37 | 2.4 | 4.4 |
| 16 | 1P | 2.3 | 20 | E | <1.0 | 36 | 1.9 | 3.7 |
| 17 | 1Q | 1.1 | 20 | E | 5.0 | 38 | 0.8 | 1.6 |
| 18 | 1R | 1.0 | 10 | E | 3.0 | 28 | 3.6 | 3 |
| 19 | 1S | 2.8 | 30 | E | 1.0 | 48 | 0.5 | 4.4 |
| 20 | 1T | 0.5 | 10 | E | 3.0 | 17 | 0.4 | 0.8 |
| 21 | 1U | 2.6 | 30 | E | <1.0 | 45 | <0.1 | 2.4 |
| 22 | 1V | 2.5 | 30 | E | <1.0 | 48 | <0.1 | 1.9 |

TABLE 2-continued

| Examples | Liquid composition | pH | Temperature (° C.) | Removal of residue | E.R. (Å/min) Co | Al$_2$O$_3$ | TEOS | SiN |
|---|---|---|---|---|---|---|---|---|
| 23 | 1W | 0.5 | 10 | E | 4.0 | 25 | 2.9 | 2.1 |
| 24 | 1X | 2.7 | 20 | E | 5.0 | 37 | 2.1 | 3.9 |
| 25 | 1AA | 0.5 | 20 | E | 4.0 | 49 | 4.4 | 3 |
| 26 | 1AB | 3.5 | 30 | E | <1.0 | 54 | 1.9 | 4.5 |
| 27 | 1AC | 2.7 | 20 | E | <1.0 | 41 | 2.8 | 4.9 |
| 28 | 1AD | 2.9 | 20 | E | <1.0 | 41 | 3.1 | 4.8 |
| 29 | 1AE | 2.8 | 20 | E | 1.0 | 41 | 3.1 | 4.7 |
| 30 | 1AF | 2.8 | 20 | E | 1.0 | 41 | 2.9 | 4.9 |
| 31 | 1AG | 2.6 | 20 | E | <1.0 | 39 | <0.1 | 1.9 |
| 32 | 1AH | 2.6 | 20 | E | <1.0 | 40 | <0.1 | 1.8 |
| 33 | 1AI | 2.6 | 20 | E | <1.0 | 41 | <0.1 | 1.6 |
| 34 | 1AJ | 2.6 | 20 | E | 1.0 | 39 | <0.1 | 1.9 |
| 35 | 1AK | 2.6 | 20 | E | 2.0 | 38 | <0.1 | 2.4 |
| 36 | 1AL | 2.3 | 20 | E | 2.0 | 41 | 0.2 | 2.1 |
| 37 | 1AM | 2.3 | 20 | E | <1.0 | 40 | <0.1 | 1.1 |
| 38 | 1AN | 2.3 | 20 | E | <1.0 | 42 | <0.1 | 1 |
| 39 | 1AO | 2.3 | 20 | E | <1.0 | 39 | 1.3 | 2.5 |
| 40 | 1AP | 2.3 | 20 | E | <1.0 | 40 | <0.1 | 1.3 |

TABLE 3

| Liquid composition | HBF$_4$ (A) % by mass | B(OH)$_3$ (B1) % by mass | HF (B2) % by mass | BT compound (C) Type | % by mass | Other components Type | % by mass | H$_2$O % by mass |
|---|---|---|---|---|---|---|---|---|
| 2A | | | | | | KOH | 0.6 | 92.4 |
| | | | | | | H$_2$O$_2$ | 6.0 | |
| | | | | | | BaN$_2$O$_6$ | 0.001 | |
| | | | | | | 1,2,4-triazole | 1.0 | |
| 2B | | 0.1 | 0.1 | BT | 0.5 | (NH$_4$)$_2$SO$_4$ | 2.5 | 96.1 |
| | | | | | | DBU | 0.72 | |
| 2C | | | | 5-MBT | 0.22 | Butyl Glycol | 10 | 89.7 |
| | | | | | | EDTA | 0.05 | |
| | | | | | | L-Arginine | 0.08 | |
| 2D | | 0.05 | | 5-MBT | 0.5 | | | 99.5 |
| 2E | | | 0.04 | 5-MBT | 0.5 | | | 99.5 |
| 2F | | | | | | NH$_4$F | 5.0 | 95.0 |

BT: benzotriazole
5-MBT: 5-methyl-1H-benzotriazole
DBU: 1,8-diazabicycloundec-7-ene

TABLE 4

| Comparative Examples | Liquid composition | pH | Temperature (° C.) | Removal of residue | E.R. (Å/min) Co | Al$_2$O$_3$ | TEOS | SiN |
|---|---|---|---|---|---|---|---|---|
| 1 | 2A | 10.2 | 80 | P | 1.0 | 29 | 7.0 | 1.6 |
| 2 | 2B | 6.0 | 60 | P | 2.0 | >64 | 0.4 | 1.0 |
| 3 | 2C | 6.4 | 80 | P | 33 | 2 | <0.1 | 0.1 |
| 4 | 2D | 5.4 | 20 | P | <1.0 | <1.0 | 0.1 | 0.1 |
| 5 | 2E | 2.5 | 20 | P | 2.0 | 35 | 2.4 | 5.2 |
| 6 | 2F | 6.8 | 20 | P | unmeasured | 52 | 5.3 | 2.5 |

REFERENCE SIGNS LIST

1: dry etching residue
2: zirconia-based hard mask
3: cobalt or cobalt alloy
4: alumina
5: low-dielectric-constant interlayer insulating film
6: silicon nitride

The invention claimed is:

1. A liquid composition, which comprises tetrafluoroboric acid (A) in a concentration of 0.01 to 30% by mass or boric acid (B1) and hydrogen fluoride (B2) in a ratio (B1)/(B2) of (0.0001 to 5.0% by mass)/(0.005 to 5.0% by mass), and which has a pH of 0.0 to 4.0,
    wherein the liquid composition further comprises a compound (D) having a pyrrolidone structure in a concentration of 0.0001 to 5% by mass, wherein a weight average molecular weight of (D) is 1,000 to 5,000,000, and wherein a ratio of the pyrrolidone structure is 10% or more.

2. The liquid composition of claim 1, which comprises (A) and (B2) in a ratio (A)/(B2) of (0.01 to 30% by mass)/(0.005 to 5.0% by mass).

3. The liquid composition of claim 1, which comprises (A), (B1) and (B2) in a ratio (A)/(B1)/(B2) of (0.01 to 30% by mass)/(0.0001 to 5.0% by mass)/(0.005 to 5.0% by mass).

4. The liquid composition of claim 1, wherein the concentration of (A) is 0.3 to 15% by mass.

5. The liquid composition of claim 1, wherein a concentration of (B1) is 0.0003 to 3.5% by mass.

6. The liquid composition of claim 1, wherein a concentration of (B2) is 0.02 to 2.0% by mass.

7. The liquid composition of claim 1, which comprises a benzotriazole compound (C) in a concentration of 0.01 to 10% by mass.

8. The liquid composition of claim 7, wherein (C) comprises at least one selected from the group consisting of benzotriazole, 5-methyl-1H-benzotriazole and 2,2'-[[(methyl-1H-benzotriazol-1-yl)methyl]imino]bisethanol.

9. A method for washing a semiconductor element having a low-dielectric-constant interlayer insulating film, the method comprising contacting the semiconductor element with the liquid composition of claim 1.

10. The liquid composition of claim 1, wherein the compound (D) is selected from the group consisting of polyvinylpyrrolidone, a random copolymer containing a pyrrolidone unit, an alternating copolymer containing a pyrrolidone unit, a block copolymer containing a pyrrolidone unit, and a branched polymer containing a pyrrolidone unit.

* * * * *